(12) United States Patent
Mizusawa et al.

(10) Patent No.: US 8,779,652 B2
(45) Date of Patent: Jul. 15, 2014

(54) AT-CUT QUARTZ-CRYSTAL VIBRATING PIECES AND DEVICES, AND METHODS FOR MANUFACTURING SAME

(75) Inventors: Shuichi Mizusawa, Saitama (JP); Takehiro Takahashi, Saitama (JP); Kunio Morita, Saitama (JP); Masakazu Harada, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 258 days.

(21) Appl. No.: 13/334,640

(22) Filed: Dec. 22, 2011

(65) Prior Publication Data

US 2012/0169182 A1    Jul. 5, 2012

(30) Foreign Application Priority Data

Jan. 5, 2011    (JP) ................................. 2011-000630
Jun. 8, 2011    (JP) ................................. 2011-128193

(51) Int. Cl.
*H03H 9/15* (2006.01)
*H03H 9/19* (2006.01)
*H03H 9/10* (2006.01)
*H03H 3/04* (2006.01)

(52) U.S. Cl.
CPC .............. *H03H 9/1035* (2013.01); *H03H 9/19* (2013.01); *H03H 3/04* (2013.01)

USPC ........................... 310/361; 310/320; 310/348

(58) Field of Classification Search
CPC ..... H03H 9/10; H03H 9/1035; H03H 9/0595; H03H 9/19; H03H 9/02007; H03H 9/02157
USPC .................................. 310/320, 348, 361, 368
See application file for complete search history.

(56) References Cited

U.S. PATENT DOCUMENTS

2009/0300894 A1 *  12/2009  Naito et al. ................... 29/25.35

FOREIGN PATENT DOCUMENTS

JP    2007-288331    11/2007

* cited by examiner

*Primary Examiner* — Derek Rosenau
(74) *Attorney, Agent, or Firm* — Klarquist Sparkman, LLP

(57) ABSTRACT

AT-cut quartz-crystal vibrating pieces and corresponding quartz-crystal devices are disclosed each having a vibrating portion surrounded by a frame portion across a through-slot configured to provide a wide vibrating portion. An exemplary vibrating piece has a quartz-crystal vibrating portion that vibrates when electrically energized, a frame portion surrounding the vibrating portion, and a through-slot defined between the vibrating portion and the frame portion. The through-slot includes a first through-slot extending in the X-axis direction along +Z'-edge of the vibrating portion, and a second through-slot extending in the X-axis direction along the −Z'-edge of the vibrating portion. The first through-slot has a different width than the second through-slot.

10 Claims, 12 Drawing Sheets

Fig. 6
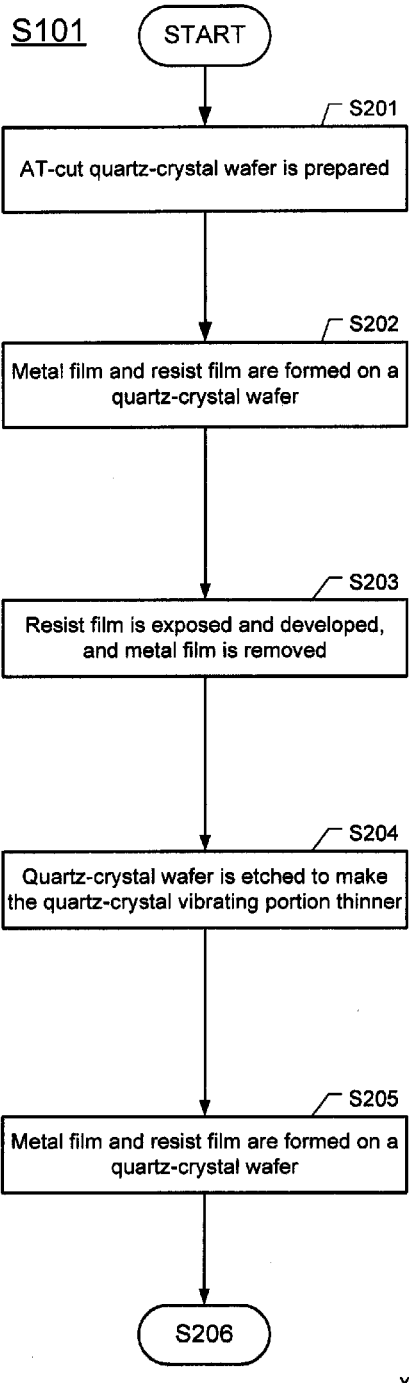
FIG. 6A
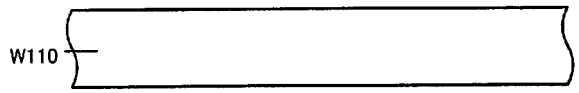
FIG. 6B
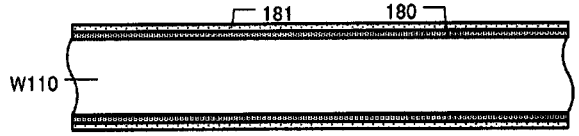
FIG. 6C
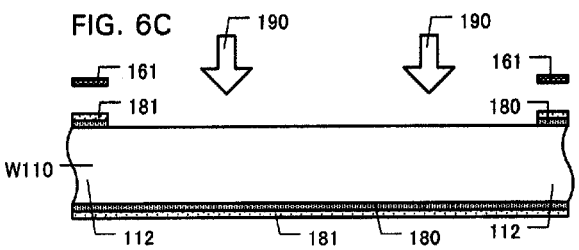
FIG. 6D
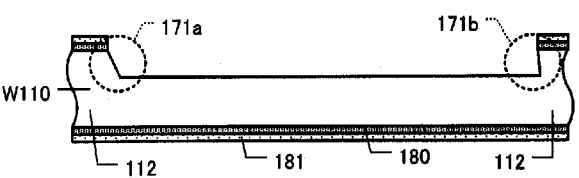
FIG. 6E
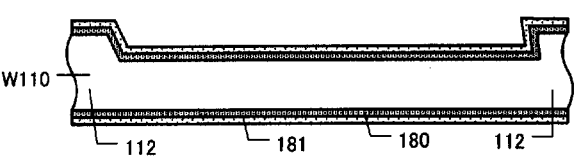
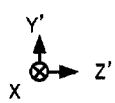

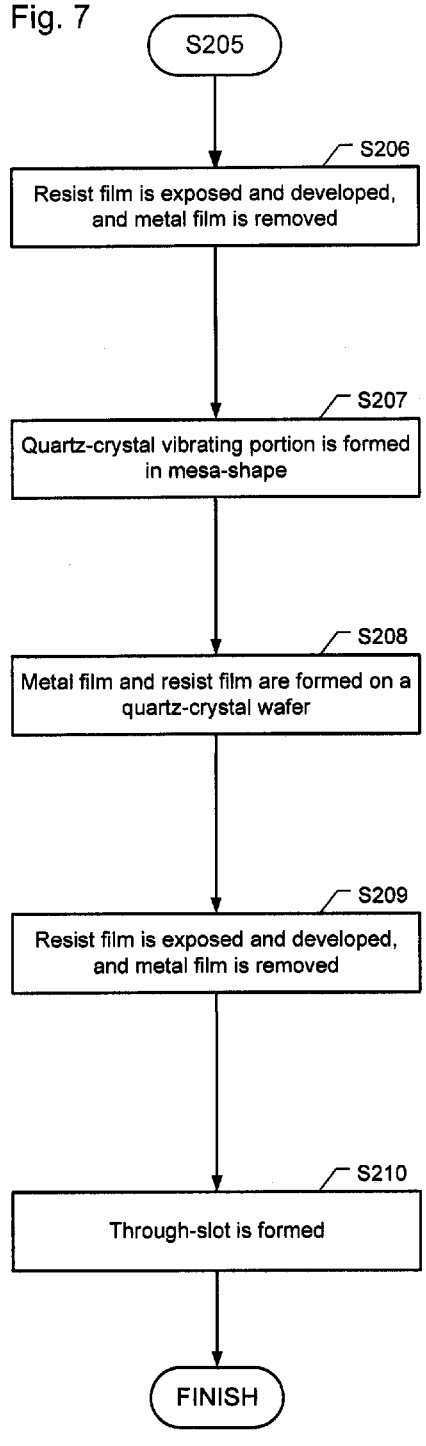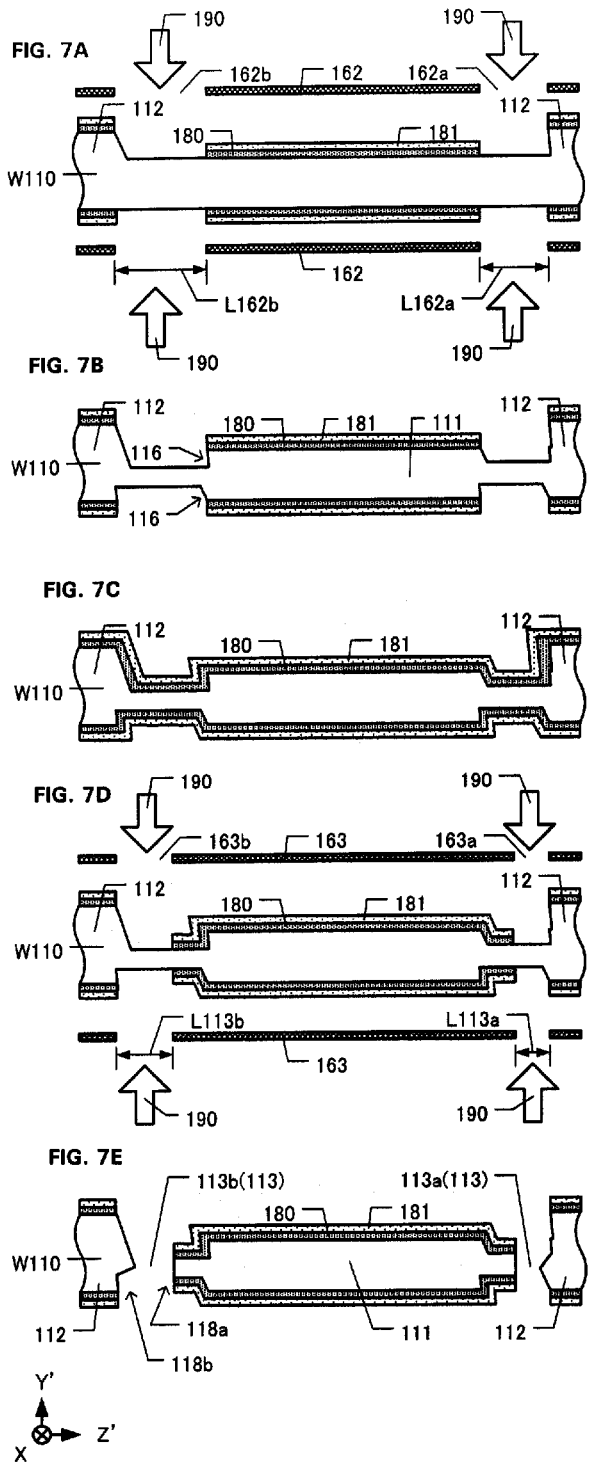

Fig. 10A
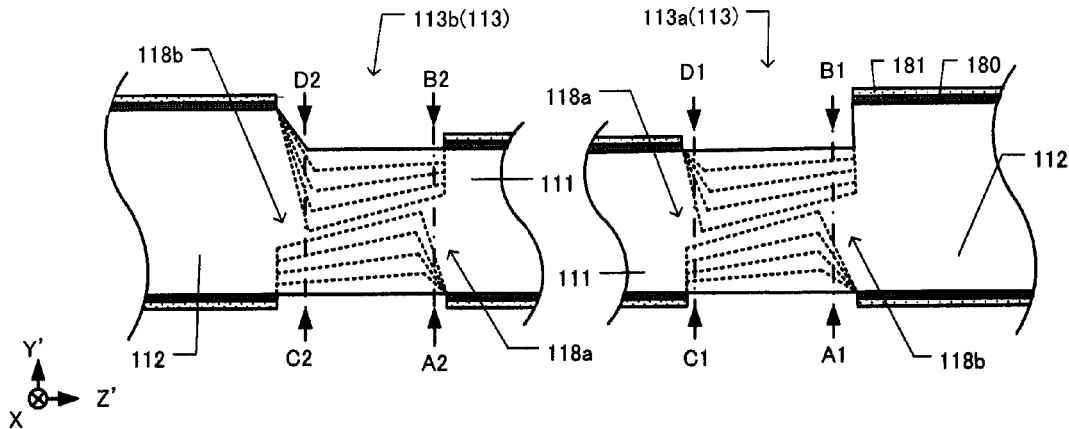
Fig. 10B
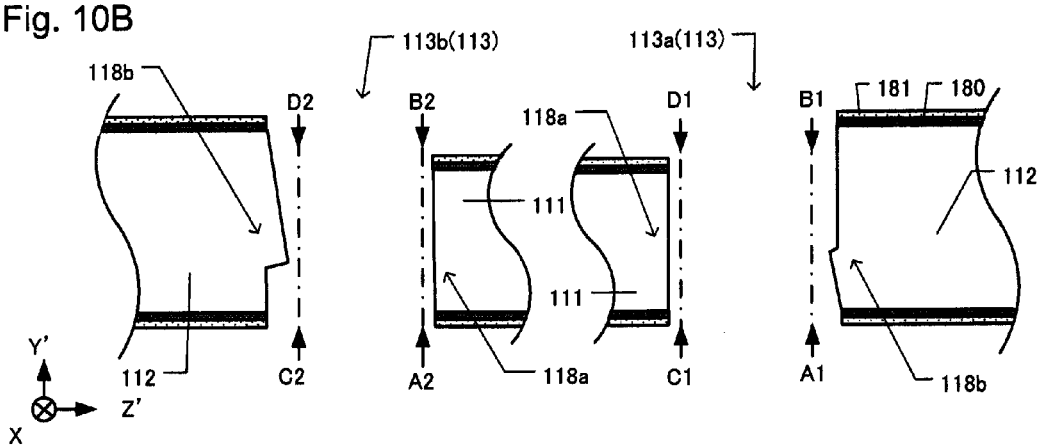
Fig. 10C
|  | L113a | L113b | L111 | 113a | 113b |
|---|---|---|---|---|---|
| Ex1 | 0.07 mm | 0.07 mm | 0.76 mm | × | × |
| Ex2 | 0.08 mm | 0.08 mm | 0.74 mm | ○ | × |
| Ex3 | 0.10 mm | 0.10 mm | 0.70 mm | ○ | ○ |
| Ex4 | 0.08 mm | 0.10 mm | 0.72 mm | ○ | ○ |

AT-CUT QUARTZ-CRYSTAL VIBRATING PIECES AND DEVICES, AND METHODS FOR MANUFACTURING SAME

CROSS-REFERENCE TO RELATED APPLICATION

This application claims priority to and the benefit of Japan Patent Application No. 2011-000630, filed on Jan. 5, 2011, and Japan Patent Application No. 2011-128193, filed on Jun. 8, 2011, in the Japan Patent Office, the disclosures of which are incorporated herein by reference in their respective entireties.

FIELD

This disclosure relates to, inter alia, AT-cut quartz-crystal vibrating pieces having through-slots, and to quartz-crystal devices comprising same and to methods for manufacturing same.

DESCRIPTION OF THE RELATED ART

Conventionally, a quartz-crystal device comprising a vibrating portion vibrates whenever electrical voltage is applied to the vibrating portion. Such a quartz-crystal device comprises a quartz-crystal vibrating piece that includes a quartz-crystal vibrating portion and a frame portion surrounding the vibrating portion. Multiple quartz-crystal devices can be manufactured simultaneously by methods including forming multiple quartz-crystal devices on a wafer. The vibrating piece is typically made of AT-cut quartz crystal, which exhibits good thermal characteristics. During manufacture of the vibrating piece, a U-shaped "through-slot" (i.e., a slot extending completely through the thickness dimension of the wafer) is formed between the frame portion and the vibrating portion on an AT-cut quartz-crystal wafer. The through-slot is formed by etching of the AT-cut quartz-crystal wafer.

Etching of AT-cut quartz-crystal proceeds at a rate that depends upon location, due to the anisotropic nature of quartz-crystal. Hence, during conventional manufacture of AT-cut quartz-crystal vibrating pieces, the vibrating portions must be formed smaller and the through-slots must be formed wider to ensure reliable production of pieces having proper through-slots. Japan Unexamined Patent Document No. 2007-288331 discusses a method for manufacturing piezoelectric vibrating pieces in which the through-slots are not excessively wide and have vibrating portions that are not excessively narrow, while still producing stable vibrations. The method involves forming an affected portion that does not exhibit anisotropy during etching of the through-slot. However, to attain these benefits, JP '331 requires an additional step of forming an affected portion in conjunction with forming the quartz-crystal vibrating portion. This additional step adds unwelcome complexity, and hence additional cost, to the manufacturing process.

The present invention provides, inter alia, AT-cut quartz-crystal vibrating pieces, and quartz-crystal devices comprising these pieces, in which the through-slot is configured to allow formation of wider vibrating portions without having to perform an additional step during formation of the through-slots.

SUMMARY

A first aspect of the invention is directed to AT-cut quartz-crystal vibrating pieces having a longitudinal-axis direction denoted as an X-axis direction, a thickness direction denoted as a Y'-axis direction, and a short-axis direction denoted as a Z'-axis direction. An exemplary vibrating piece comprises a quartz-crystal vibrating portion that vibrates when electrically energized. The vibrating portion has an X-axis dimension and a Z'-axis dimension. A frame portion surrounds the vibrating portion, and a through-slot is defined between the vibrating portion and the frame portion. The through-slot extends thickness-wise through the vibrating piece in the Y'-axis direction. The through-slot includes a first through-slot extending in the X-axis direction along a +Z'-edge of the vibrating portion and a second through-slot extending in the X-axis direction along a −Z'-edge of the vibrating portion. The first through-slot has a different Z'-direction width than the second through-slot. Desirably, the Z'-direction width of the first through-slot is less than the Z'-direction width of the second through-slot. Also, the frame portion desirably has greater Y'-axis thickness than the vibrating portion.

The vibrating portion desirably has a mesa-shape, having a Y'-direction thickness in a central region thereof that is greater than a Y'-direction thickness in a peripheral region thereof.

Also, if the vibrating portion comprises a −Z'-edge surface and a +Z'-edge surface facing respective first and second through-slots, the −Z'-edge surface and +Z'-edge surface desirably are planar surfaces.

According to another aspect, quartz-crystal devices are provided that comprise an AT-cut quartz-crystal vibrating piece as summarized above, wherein the AT-cut quartz-crystal vibrating piece comprises a +Y'-surface and a −Y'-surface. A first plate is bonded to the +Y'-surface in the manner of a package lid, and a second plate is bonded to the −Y'-surface in the manner of a package base.

Another embodiment of an AT-cut quartz-crystal vibrating piece has a longitudinal-axis direction denoted as a Z'-axis direction, a thickness direction denoted as a Y'-axis direction, and a short-axis direction denoted as an X-axis direction. The vibrating piece comprises a quartz-crystal vibrating portion that vibrates when electrically energized, wherein the vibrating portion has an X-axis dimension and a Z'-axis dimension. A frame portion surrounds the vibrating portion, and a through-slot is defined between the vibrating portion and the frame portion. The through-slot extends thickness-wise through the vibrating piece in the Y'-axis direction. The through-slot includes a first through-slot extending in the X-axis direction along a +Z'-edge of the vibrating portion and a second through-slot extending in the X-axis direction along a −Z'-edge of the vibrating portion. The first through-slot has a different Z'-direction width than the second through-slot. Desirably, the Z'-direction width of the first through-slot is less than the Z'-direction width of the second through-slot.

According to another aspect, methods are provided for manufacturing an AT-cut quartz-crystal vibrating piece, having a longitudinal-axis direction denoted as an X-axis direction, a thickness direction denoted as a Y'-axis direction, and a short-axis direction denoted as a Z'-axis direction. The vibrating piece includes a vibrating portion that vibrates whenever it is appropriately energized electrically, and includes a frame portion surrounding the vibrating portion. The vibrating piece also defines a through-slot extending thickness-wise in the Y'-axis direction and being situated between the vibrating portion and the frame portion. An embodiment of the method comprises preparing an AT-cut quartz-crystal wafer on which multiple AT-cut quartz-crystal vibrating pieces are destined to be formed. The vibrating pieces have respective vibrating portions. A mask is prepared for etching the respective through-slots of the vibrating pieces, wherein each through-slot comprises first and second etching regions. The first etching region is situated along a +Z'-edge of the vibrating portion and extends in the X-axis direction. The second etching region is situated along a −Z'-edge of the vibrating portion and extends in the X-axis direction. The first through-slot has a different width than the second through-slot. Using the mask, patterns are exposed on the AT-cut quartz-crystal wafer corresponding to the respective through-slots. The AT-cut quartz-crystal wafer is then etched to form the through-slots according to the exposed patterns.

The method summarized above can further comprise, after preparing the AT-cut quartz-crystal wafer, etching the AT-cut quartz-crystal wafer to provide the vibrating portions with less thickness in the Y'-axis direction than the frame portions.

The method summarized above can further comprise, after preparing the AT-cut quartz-crystal wafer, etching the vibrating portions to provide them with greater thickness in central regions thereof compared to peripheral regions thereof, thereby providing the vibrating portions with respective mesa-shapes.

The method summarized above can further comprise, after preparing the AT-cut quartz-crystal wafer, etching the AT-cut quartz-crystal wafer to provide the vibrating portions with less thickness in the Y'-axis direction than the frame portions. Afterward, but before etching the AT-cut quartz-crystal wafer to form the through-slots, the vibrating portions can be etched to provide them with greater thickness in central regions thereof compared to peripheral regions thereof, thereby providing the vibrating portions with respective mesa-shapes.

Another method embodiment is directed to manufacture of an AT-cut quartz-crystal vibrating piece having a longitudinal-axis direction denoted as a Z'-axis direction, a short-axis direction denoted as an X-axis direction, and a thickness direction denoted as a Y'-axis direction. The vibrating piece includes a vibrating portion that vibrates whenever it is appropriately energized electrically. The vibrating piece includes a frame portion surrounding the vibrating portion and defining a through-slot extending thickness-wise in the Y'-axis direction. The through-slot is situated between the vibrating portion and the frame portion. In the method an AT-cut quartz-crystal wafer is prepared on which multiple AT-cut quartz-crystal vibrating pieces are destined to be formed. The vibrating pieces have respective vibrating portions. A mask is prepared for etching the respective through-slots of the vibrating pieces. Each through-slot comprises first and second etching regions. The first etching region is situated along a −Z'-edge of the vibrating portion and extends in the X-axis direction, and the second etching region is situated along a +Z'-edge of the vibrating portion and extends in the X-axis direction. The first through-slot has a different width than the second through-slot. The AT-cut quartz-crystal wafer is etched to form the through-slots according to the exposed patterns.

After preparing the AT-cut quartz-crystal wafer, the AT-cut quartz-crystal wafer can be further etched to provide the vibrating portions with less thickness in the Y'-axis direction than the frame portions.

After preparing the AT-cut quartz-crystal wafer, the vibrating portions can be further etched to provide them with greater thickness in central regions thereof compared to peripheral regions thereof, thereby providing the vibrating portions with respective mesa-shapes.

After preparing the AT-cut quartz-crystal wafer, the method can further comprise etching the AT-cut quartz-crystal wafer to provide the vibrating portions with less thickness in the Y'-axis direction than the frame portions. Afterward, but before etching the AT-cut quartz-crystal wafer to form the through-slots, the vibrating portions are further etched to provide them with greater thickness in central regions thereof compared to peripheral regions thereof, thereby providing the vibrating portions with respective mesa-shapes.

According to the present invention, AT-cut quartz-crystal vibrating pieces, quartz-crystal devices comprising same, and methods for manufacturing same are provided, in which the through-slots are formed to provide a wider vibrating portion without requiring an extra manufacturing step for forming the through-slots.

BRIEF DESCRIPTION OF THE DRAWINGS

FIG. 6 is a flow-chart of an exemplary method for manufacturing the quartz-crystal wafer of FIG. 5, wherein FIGS. 6A-6D depict the result of the corresponding step.

FIG. 7 is a continuation of the flow-chart of FIG. 6, wherein FIGS. 7A-7E depict the result of the corresponding step.

FIG. 10A is an elevational section showing a time sequence of etching of the through-slot defined by the quartz-crystal wafer.

FIG. 10B is an elevational section showing details of the through-slot formed as shown in FIG. 10A.

FIG. 10C is table of data obtained in an experiment to determine whether the through-slot extends completely in the Y'-axis direction if the width in the Z'-axis direction is changed in a second through-slot compared to a first through-slot.

FIG. 11A is a graph showing the relationship between temperature and CI of a quartz-crystal vibrating piece having a vibrating portion of which the width is L111a.

DETAILED DESCRIPTION

Various representative embodiments are described below with reference to the respective drawings. It will be understood that the scope of the disclosure is not limited to the described embodiments, unless otherwise stated.

First Embodiment

Figure 1:
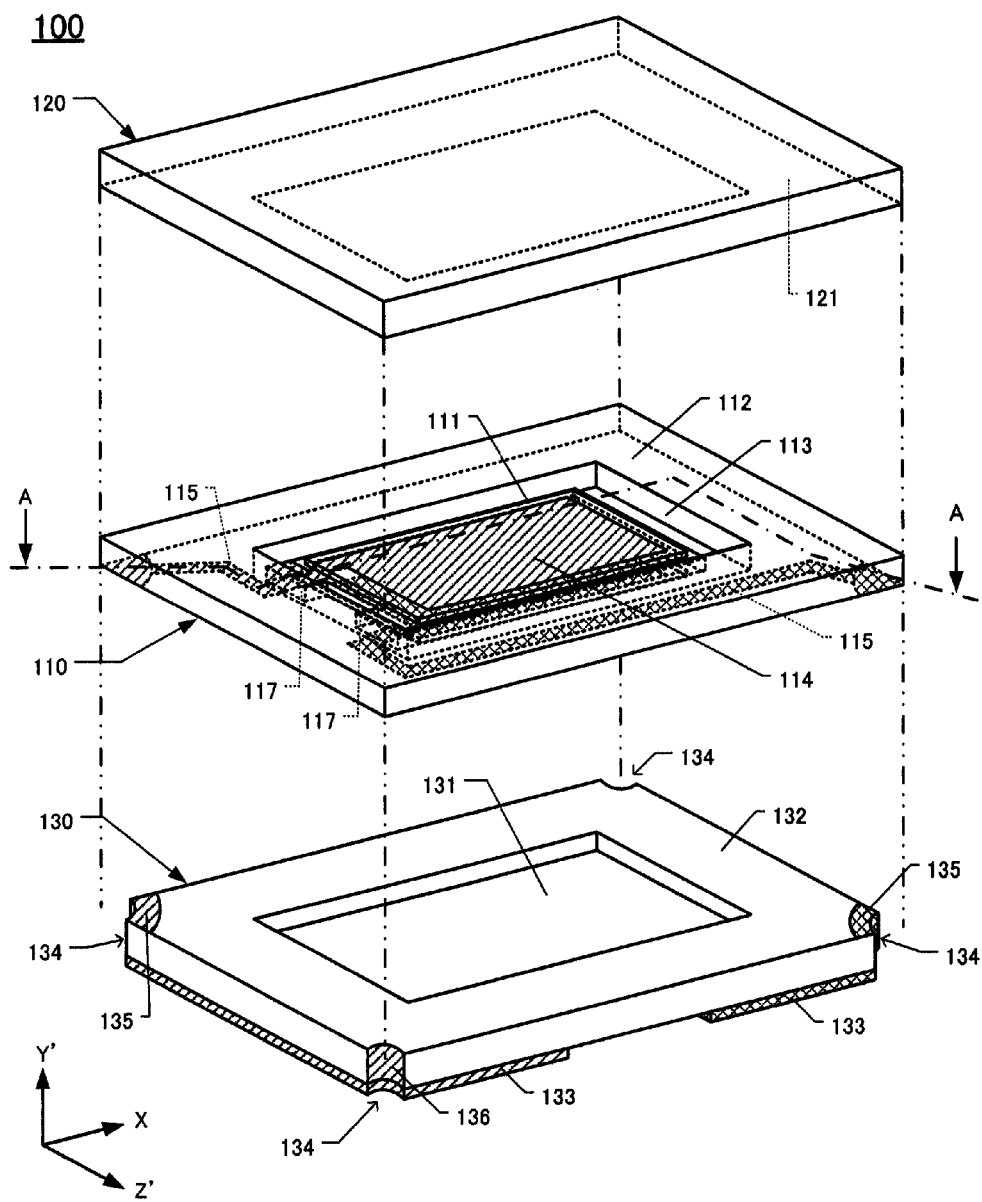
FIG. 1 is an exploded perspective view of a first embodiment of a quartz-crystal device.

FIG. 1 is an exploded perspective view of a quartz-crystal device 100 according to this embodiment. The quartz-crystal device 100 is a surface-mountable quartz-crystal device that can be mounted on, for example, a "printed" substrate such as a printed circuit board. The quartz-crystal device 100 comprises a quartz-crystal frame 110, a package lid 120, and a package base 130. The quartz-crystal frame 110 is fabricated from an AT-cut quartz-crystal material. An AT-cut quartz-crystal material has a principal surface (in the YZ plane) that is tilted by 35° 15' about the Y-axis of a crystal-coordinate system (XYZ) in the direction of the Y-axis from the Z-axis around the X-axis. In the following description, new axes tilted with respect to the axial directions of the quartz-crystal material are denoted as the Y'-axis and Z'-axis, respectively. Therefore, in the quartz-crystal device 100, the longitudinal direction of the piezoelectric device is the X-axis direction, the height direction is the Y'-axis direction, and the direction perpendicular to the X-axis and Y'-axis directions is the Z'-axis direction.

The quartz-crystal frame 110 comprises a vibrating portion 111 that vibrates when electric voltage is applied to it. The quartz-crystal frame 110 also comprises a frame portion 112 surrounding the vibrating portion 111. A pair of joining portions 117 connects the vibrating portion 111 to the frame portion 112. Between the vibrating portion 111 and frame portion 112 is a through-slot 113 extending through the Y'-axis direction (thickness direction) of the quartz-crystal frame 110 and extending around at least three sides of the vibrating portion 111.

A respective excitation electrode 114 is situated on each of the +Y'-side and −Y'-side surfaces of the vibrating portion 111. Connected to each excitation electrode 114 is a respective extraction electrode 115. The extraction electrodes extend across a respective joining portion 117 to a respective corner of the frame portion 112.

More specifically, the extraction electrode 115, connected to the excitation electrode 114 on the +Y'-surface, passes to the −Y'-surface at the respective joining portion 117 and then extends to the (−Z', −X) corner of the −Y'-surface of the frame portion 112. The extraction electrode 115, connected to the excitation electrode 114 on the −Y'-surface, passes across the joining portion 117 and then extends to the (+Z', +X) corner of the −Y'-surface of the frame portion 112.

The "first plate" 120 is a planar board without any concavity or convexity on either the +Y'-surface or −Y'-surface thereof, and is disposed in the +Y'-axis direction relative to the quartz-crystal frame 110. A bonding surface 121 is disposed on the −Y'-surface of the first plate 120 for bonding to the frame portion 112. Thus, the first plate can serve as a package lid.

The "second plate" 130 is disposed on the −Y'-side of the quartz-crystal frame 110. The second plate 130 defines a recess 131 and a bonding surface 132 on the +Y'-surface thereof. Thus, the second plate can serve as a package base. A respective conductive pad 135 is located on the +Y'-surface at each corner of the second plate 130. The conductive pads 135 (and electrodes 136 in respective castellations 134) provide respective electrical connections from the +Y'-surface to the −Y'-surface of the second plate. The conductive pads 135 on the −X-corners of the −Y'-surface of the second plate 130 are connected together by an external electrode 133. Similarly, the conductive pads 135 on the +X-corners of the −Y-surface of the second plate 130 are connected together by an external electrode 133. Thus, each castellation electrode 136 is electrically connected to a respective conductive pad 135 on the +Y'-surface and to an external electrode 133 on the −Y'-surface of the second plate.

Figure 2A:
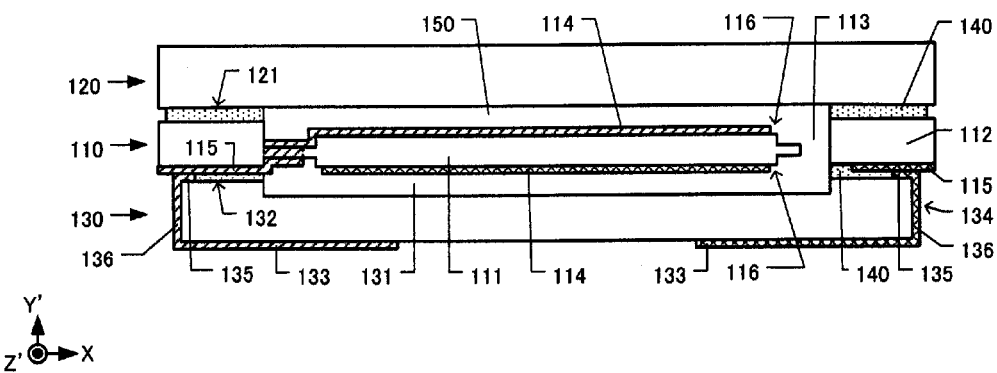
FIG. 2A is a cross-sectional view along the line A-A in FIG. 1.

FIG. 2A is a cross-sectional view of the quartz-crystal device 100 along the line A-A in FIG. 1. The first plate 120 is situated on the +Y'-side of the quartz-crystal frame 110, and the second plate 130 is situated on the opposing −Y'-side of the quartz-crystal frame. The bonding surface 121 of the first plate 120 and the bonding surface 132 of the second plate 130 are bonded to respective surfaces of the frame portion 112 using a sealing material 140. Thus, a cavity 150 defined inside the quartz-crystal device 100 is hermetically sealed using the sealing material 140. This sealing automatically connects the conductive pads 135 on the +Y'-surface (outside surface) of the second plate 130 to the respective extraction electrodes 115 located inside the frame portion 112. Also, the excitation electrodes 114 on the vibrating piece 110 are automatically connected electrically to respective external electrodes 133 via respective extraction electrodes 115, conductive pads 135, and castellation electrodes 136.

The vibrating portion 111 is thinner than the frame portion 112 and is displaced, in the −Y'-direction, relative to the frame portion 112 toward the recess 131 in the second plate 130. Also, the vibrating portion 111 in this embodiment is mesa-shaped, having central ("mesa") regions 116 on each of the −Y'- and +Y'-surfaces thereof. Thus, the vibrating portion 111 is thicker in the Y'-axis direction in the mesa regions 116 than in the peripheral regions surrounding the mesa regions. The excitation electrodes 114 are situated on respective mesa regions 116.

Figure 2B:
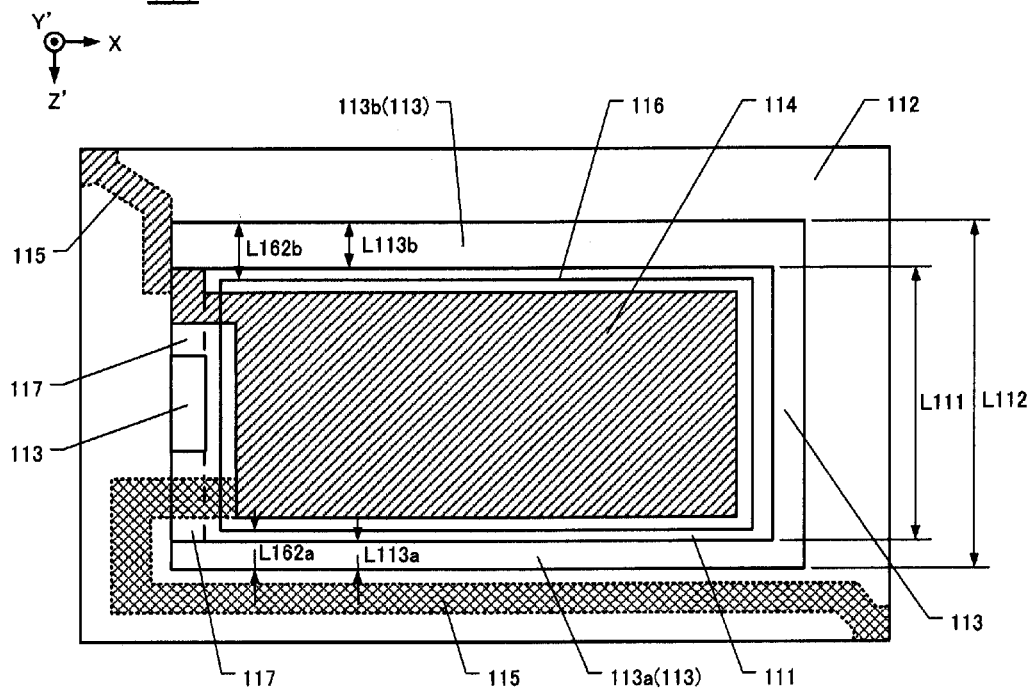
FIG. 2B is a plan view of the quartz-crystal frame of the first embodiment.

FIG. 2B is a plan view of the quartz-crystal vibrating piece 110, which comprises the vibrating portion 111, the frame portion 112, the through-slot 113, and joining portions 117. The vibrating portion 111 is mesa-shaped, and the principal surfaces thereof comprise respective excitation electrodes 114. Respective extraction electrodes 115 extend from each excitation electrode 114 to respective corners of the −Y'-axis surface of the frame portion 112. The through-slot 113 has a U-shape, of which two portions extend in the X-direction and one portion extends in the Z'-direction around three edges of the vibrating portion 111. Regarding the through-slot 113, the portion extending along the +Z'-edge of the vibrating portion 111 parallel to the X-axis direction is denoted as the "first through-slot" 113a, and the portion extending along the −Z'-edge of the vibrating portion 111 parallel to the X-axis direction is denoted as the "second through-slot" 113b. In this embodiment the width L113a of the first through-slot 113a is less than the width L113b of the second through-slot 113b. In FIG. 2B, the width in the Z'-axis direction of the vibrating portion 111 is denoted L111, and the width of the vibrating portion 111 plus the respective widths of the first and second through-slots 113 in the Z'-axis direction is denoted as L112. The width (in the +Z'-axis direction) between the mesa portion 116 and the adjacent frame portion 112 is denoted as L162a, and the width (in the −Z'-axis direction) is denoted as L162b.

Figure 3A:
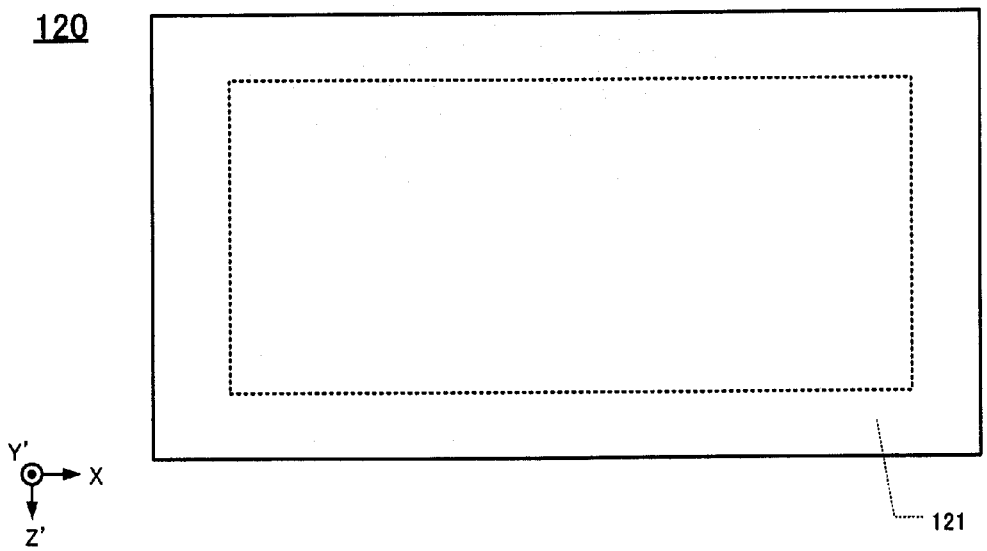
FIG. 3A is a plan view of the first plate of the first embodiment.

FIG. 3A is a plan view of the first plate 120. The first plate 120 has a rectangular profile of which the long side extends in the X-axis direction and the short side extends in the Z'-axis direction. Also, the −Y'-surface includes a peripheral bonding surface 121 that is bonded to the frame portion 112 of the vibrating piece 110.

Figure 3B:
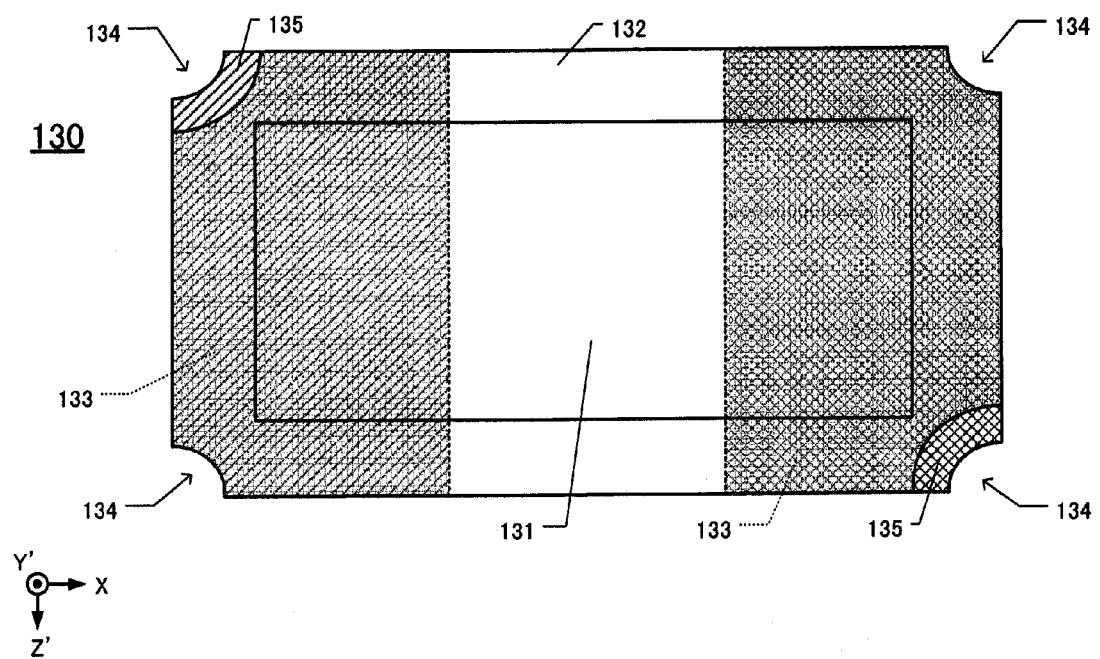
FIG. 3B is a plan view of the second plate of the first embodiment.

FIG. 3B is a plan view of the second plate 130. Respective external electrodes 133 are disposed on the +X-axis and −X-axis portions of the −Y'-surface (outer principal surface)

of the second plate 130. The opposing +Y'-surface defines a recess 131 and a bonding surface 132 peripheral to the recess 131, and includes respective conductive pads 135 that are electrically connected to respective external electrodes 133 on the +Y'-surface. Each corner of the second plate includes a respective castellation 134, and each castellation includes a respective castellation electrode 136 (see FIG. 1). The castellation electrodes 136 electrically connect the external electrodes 133 to respective conductive pads 135.

Method for Manufacturing the Quartz-Crystal Device

Figure 4:
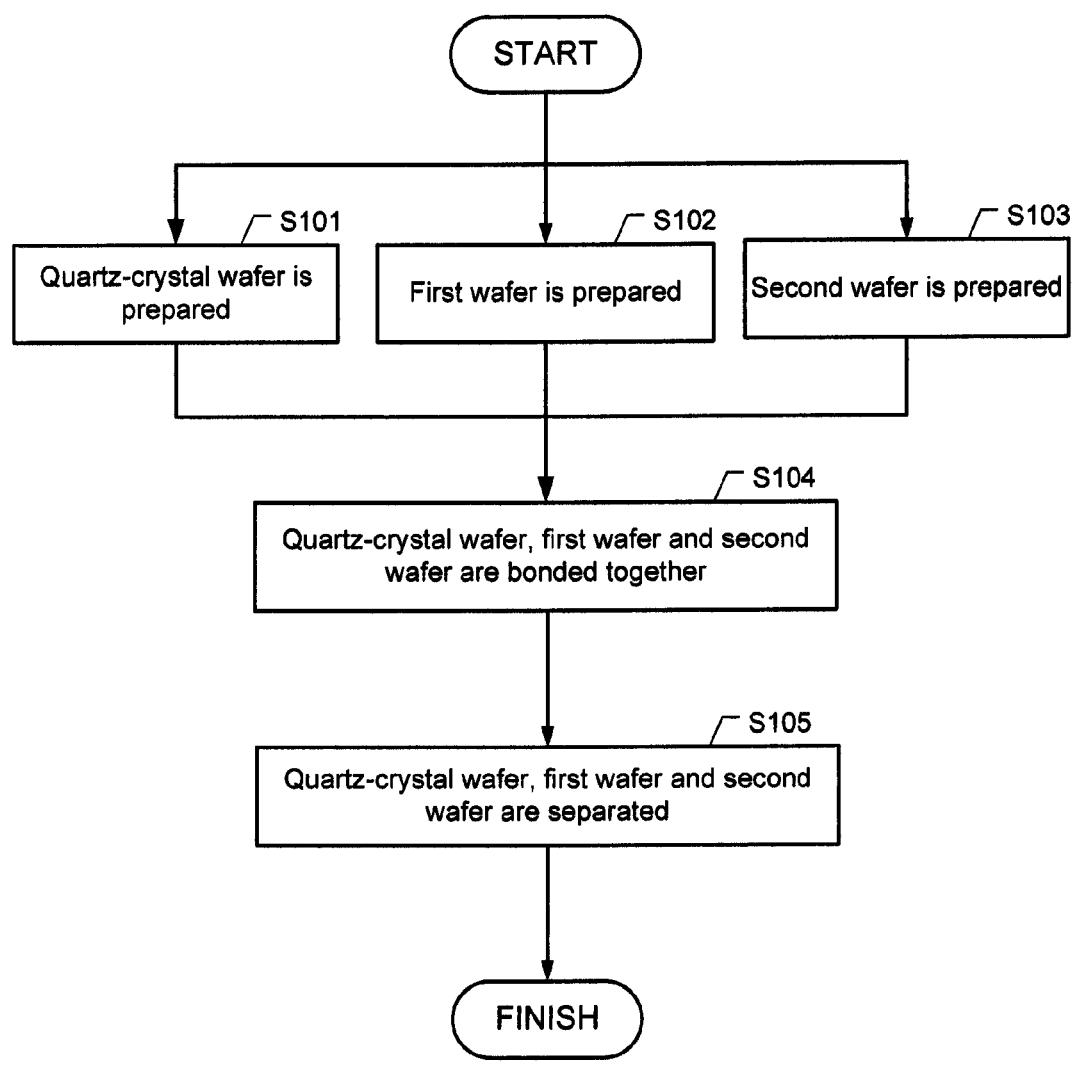
FIG. 4 is a flow-chart of an exemplary method for manufacturing the quartz-crystal device of the first embodiment.

A flow-chart of this exemplary method for manufacturing the first embodiment of a quartz-crystal device 100 is shown in FIG. 4. In step S101 a quartz-crystal wafer W110 is fabricated from an AT-cut quartz-crystal material. Multiple quartz-crystal frames 110 are formed on a quartz-crystal wafer W110 (further details of which are described below with reference to FIG. 5). Further details of a method for manufacturing the quartz-crystal wafer W110 are described later below with reference to FIGS. 6 and 7.

Figure 5:
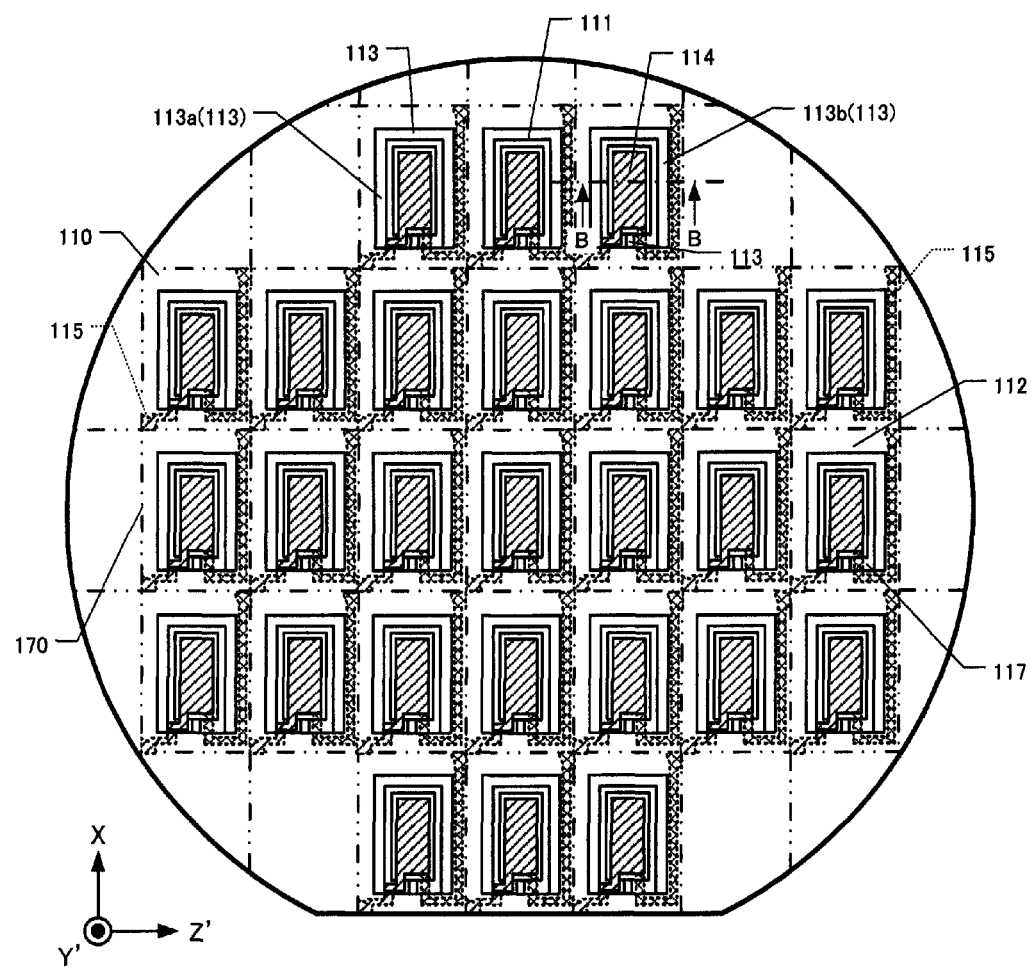
FIG. 5 is a plan view of a quartz-crystal wafer on which multiple quartz-crystal devices according to the first embodiment are formed.

FIG. 5 is a plan view of the quartz-crystal wafer W110. Multiple quartz-crystal frames 110 are formed on the wafer W110. In FIG. 5, the borders of adjacent quartz-crystal frames 110 are indicated using dash-dot lines. Each dash-dot line is a scribe line 170 used as a reference for separating individual devices in step S104 of FIG. 4. Each quartz-crystal frame 110 comprises a respective vibrating portion 111, frame portion 112, through-slot 113, and joining portions 117. Each vibrating portion 111 includes a respective excitation electrode 114 on the +Y'-surface and −Y'-surface thereof. A respective extraction electrode 115 is connected to each excitation electrode 114.

FIGS. 6 and 7 are flow-charts of steps in an exemplary method for manufacturing the quartz-crystal wafer W110. The steps shown in FIGS. 6 and 7 are particularly directed to forming the vibrating portions 111 and through-slots 113. In FIGS. 6 and 7 each step includes a respective cross-section depicting the result of the step. The cross-sections shown in FIGS. 6A and 7D are of the quartz-crystal wafer W110 along the line B-B in FIG. 5.

In step S201 of FIG. 6, an AT-cut quartz-crystal wafer W110 is prepared. FIG. 6A is a cross-sectional view of the AT-cut quartz-crystal wafer W110 as prepared. The quartz-crystal wafer W110 has principal surfaces on the +Y'-surface and on the −Y'-surface. Both surfaces are planar, without significant concavities or convexities.

In step S202 a metal film 180 and a resist film 181 are sequentially formed on both principal surfaces of the quartz-crystal wafer W110. FIG. 6B is a cross-section of the quartz-crystal wafer W110 after application of the metal film 180 and the resist film 181. The metal film 180 comprises a foundation layer of chromium (Cr) formed on both principal surfaces of the quartz-crystal wafer W110. An overlying layer of gold (Au; not shown) is formed on the surface of the chromium layer. A resist film 181 is formed on the surface of the metal film 180. The resist film 181 is, for example, a positive photoresist that, when exposed, is soluble in developer solution, while unexposed resist is insoluble.

In step S203 the resist film 181 on the upper surface of the wafer is exposed and developed, followed by removal of the metal film 180. Specifically, in this step, the metal film 180 and resist film 181 (formed on the +Y'-surface and defining the vibrating portion 111 and the through-slot 113 in FIG. 2B) are removed after exposure, except from regions of the wafer corresponding to the frame portion 112. FIG. 6C is a cross-sectional view of the quartz-crystal wafer W110 after exposing and developing the resist film 181 and after removing unprotected regions of the metal film 180. Also in this step S203, a first mask 161 is placed on the +Y'-surface of the quartz-crystal wafer W110. The first mask 161 extends over the +Y'-surface wherever frame portions 112 have been formed. After placing the first mask 161, a UV exposure light 190 is irradiated onto the +Y'-surface of the quartz-crystal wafer W110 to expose the resist film 181 in regions unprotected by the first mask 161. The wafer with exposed resist 181 is immersed in developer (not shown) to remove regions of exposed resist from the wafer surface.

In step S204 the regions of the metal film 180 not protected by remaining developer are wet-etched to reduce the thickness of the vibrating portions 111 (see FIG. 2A). FIG. 6D is a cross-sectional view of the quartz-crystal wafer W110 after performing this thickness-reducing etching step. In step S204 the +Y'-surface of the quartz-crystal wafer W110 (except for frame portions 112) is wet-etched, which reduces the thickness of the regions in contact with the etchant. During etching of the quartz-crystal material, the etching rate varies in each of the X-axis, Y'-axis, and Z'-axis directions, which results in the wafer W110 being etched in an anisotropic manner. In FIG. 6D, the etched regions 171a and 171b (each encircled by a respective dotted-line in FIG. 6D) exhibit a sloped thickness profile due to different respective etching rates and different angles relative to the principal surfaces.

In step S205 a metal film 180 and a resist film 181 are formed on both surfaces of the quartz-crystal wafer W110. More specifically, in step S205 the metal films 180 and resist films 181 remaining from step S204 are removed, followed by application of new metal layers 180 and resist layers 181 for use in forming the mesa regions 116 on the vibrating portion 111. FIG. 6E is a cross-sectional view of the quartz-crystal wafer W110, on which new films of metal 180 and resist 181 have been applied. The new metal film 180 and resist film 181 are formed on both the +Y'- and −Y'-surfaces of the quartz-crystal wafer W110.

In step S206, the resist film 181 is exposed and developed, and resulting unprotected regions of the metal film 180 and resist film 181 (including regions having width L162a and L162b) are removed from the +Z'-surface and −Z'-surface of the frame portion 112 (see FIG. 2B). FIG. 7A is a cross-sectional view of the quartz-crystal wafer W110, on which the resist film 181 has been exposed and developed, and from which the metal film 180 has been removed. Specifically, the metal film 180 and resist film 181, formed on the periphery of the vibrating portion 111 and on the +Y'-axis and −Y'-axis surfaces of the through-slot 113 (see FIG. 3A), are removed. Respective second masks 162 are placed relative to the +Y'-surface and −Y'-surface of the wafer W110. The second mask 162 defines a first etching region 162a having the width L162a and a second etching region 162b having the width L162b. After placing the second masks 162, UV exposure light 190 is irradiated onto the +Y'-surface and −Y'-surface of the wafer W110 to expose the resist. Then, the resist film 181 is immersed into developer (not shown) to remove exposed resist. Here, the Z'-direction width L162a of the first etching region 162a is not equal to the Z'-direction width L162b of the second etching region 162b. Specifically, the width L162a is less than the width L162b.

In step S207, the vibrating portion 111 is provided with a mesa-shape. This is done in this step by wet-etching the periphery of the quartz-crystal vibrating portion 111 to reduce the thickness of the periphery. FIG. 7B is a cross-sectional view of the quartz-crystal wafer W110, after the thickness of the outer periphery of the quartz-crystal vibrating portion 111 has been reduced in this step. In this step S207, both the +Y'-axis and −Y'-axis peripheral surfaces of the vibrating portion 111 are wet-etched to provide the vibrating portion 111 with a mesa portion 116.

In step S208, new metal film 180 and resist film 181 are sequentially formed on both surfaces of the quartz-crystal wafer W110. More specifically, after completing step S207, remaining metal film 180 and resist film 181 are removed, followed by application of new metal films 180 and resist films 181 (FIG. 3A) on both surfaces of the wafer. The new metal films and resist films are destined for use in forming the through-slots 113 (FIG. 2B). FIG. 7C is a cross-sectional view of the quartz-crystal wafer W110 after formation of new metal film 180 and new resist film 181 on each of the +Y'-surface and −Y'-surface of the wafer W110.

In step S209 the resist film 181 is exposed and developed, and denuded regions of metal film are removed. More specifically, exposed regions of the metal film 180 having widths L113a and L113b (see FIG. 2B) in the Z'-axis directions are removed from both surfaces of the frame portion 112. FIG. 7D is a cross-sectional view of the result of this step, showing a section of the wafer W110 from which new metal film 180, unprotected by developed resist, has been removed by etching from both surfaces of the wafer. Third masks 163 are placed relative to the +Y'-surface and −Y'-surface of the wafer W110. The third masks 163 cover the entire respective surfaces of the wafer except for regions destined to become the through-slots 113. More specifically, the masks that define respective etching regions 163a and 163b are foamed on the third mask 163. The width of the first etching region in the Z'-axis direction from the frame portion 112 in the +Z'-axis side is denoted L113a, and the width of the second etching region in the Z'-axis direction from the frame portion 112 in the −Z'-axis side this denoted L113b. After placing the third masks 163, UV exposure light 190 is irradiated onto both surfaces of the wafer W110 to expose the resist film 181. Exposed resist film 181 is immersed in developer (not shown), followed by removal of developed resist. Here, L163a≠L163b; more specifically, L163a<L163b.

In step S210, regions of the wafer W110 unprotected by resist are wet-etched, thereby forming the through-slots 113. FIG. 7E is a cross-sectional view of the quartz-crystal wafer W110 after formation of the through-slots 113 in this step. Note that the quartz-crystal material of the wafer W110 is etched at a slope relative to principal surfaces of the wafer. This is due to the anisotropic aspect of the AT-cut quartz-crystal material. Anisotropic etching of AT-cut quartz-crystal material produces convexities and concavities on the edge-surfaces of the first through-slot 113a and the second through-slot 113b. In contrast, the edge surface of the vibrating portion 111 facing the first through-slot 113a and edge surface 118a of the second through-slot 113b are formed as planar surfaces without significant convexities or concavities.

After step S210, the metal film 180 and the resist film 181 are removed and the excitation electrodes 114 and extraction electrodes 115 are formed, thereby forming the quartz-crystal wafer W110 shown in FIG. 5. The excitation electrodes 114 and extraction electrodes 115 each comprise a layer of chromium with an overlying layer of gold, similar to the metal film 180.

Figure 8:
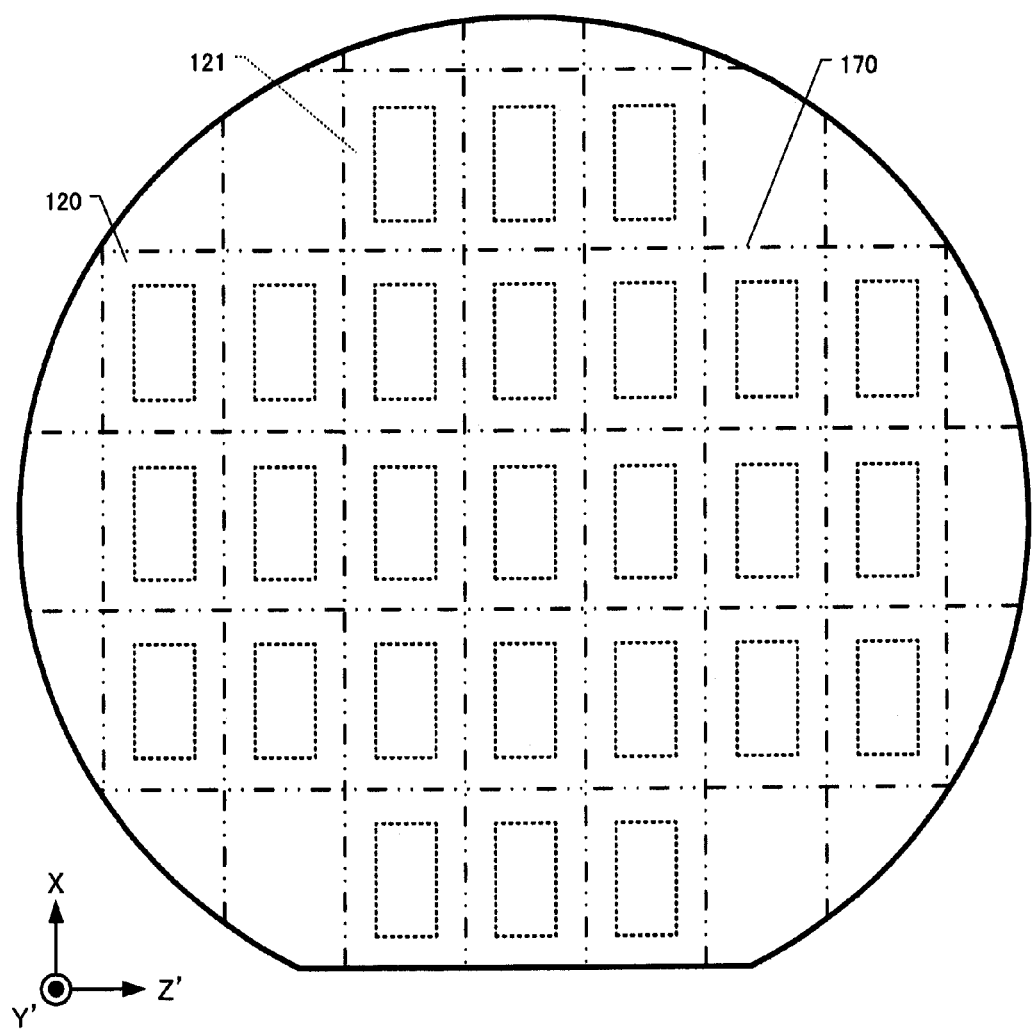
FIG. 8 is a plan view of a first wafer used in mass-production of quartz-crystal vibrating devices.
Figure 9:
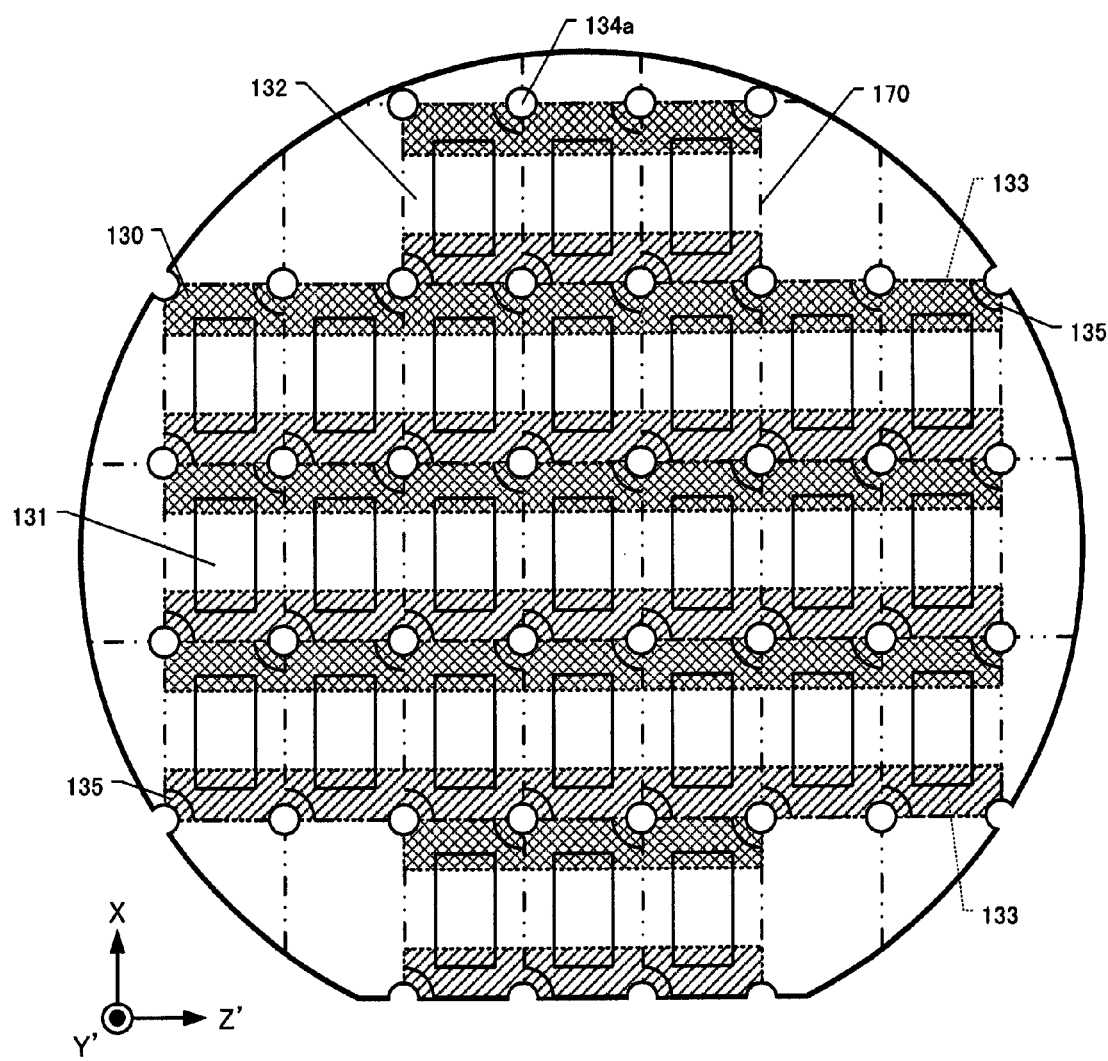
FIG. 9 is a plan view of a second wafer used in mass-production of quartz-crystal vibrating devices.

Returning to FIG. 4, in step S102 the lid wafer W120 is prepared. Multiple first plates 120 are formed simultaneously on the lid wafer W120. The lid wafer W120 can be fabricated of the quartz-crystal material (used for fabricating the wafer W110) or glass. An exemplary lid wafer W120 is shown in FIG. 8, in which the depicted lid wafer W120 defines multiple first plates 120 destined to become respective package lids. The dot-dash lines in FIG. 9 are scribe lines 170 that denote the borders of the adjacent first plates 120. During assembly of a quartz-crystal device 100, a first plate 120 is bonded to the bonding surface 121 of a frame portion 112 of a corresponding quartz-crystal frame 110. The bonding surface 121 is the −Y'-surface of the frame portion.

In step S103, the base wafer W130 is prepared. Multiple second plates (destined to become respective package bases 130) are formed simultaneously on the base wafer W130. The base wafer W130 can be fabricated of the quartz-crystal material or glass, for example. An exemplary base wafer W130 is shown in FIG. 10, in which the depicted base wafer W130 defines multiple second plates 130. The dot-dash lines 170 In FIG. 9 are scribe lines that denote the borders of the adjacent second plates 130. Each second plate 130 has a −Y'-surface (outer principal surface) on which external electrodes 133 are formed. Corresponding conductive pads 135 are formed on the +Y'-axis surface. Respective scribe lines extend in the X-axis and Z'-axis directions, and respective through-holes 134a are defined at each intersection of X- and Z'-direction scribe lines 170. The through-holes 134a extend through the base wafer W130 in the Y'-axis (thickness) direction. The through-holes 134a form respective castellations 134 (see FIG. 1) during the device-separation step S105. Respective castellation electrodes 136 (see FIG. 1) are formed on the inner walls of the through-holes 134a, and respective external electrodes 133 are electrically connected to the conductive pads 135. A respective recess 131 is formed on each second plate 130 facing the +Y'-direction. The bonding surfaces 132 are peripheral to the respective recesses 131.

In step S104 a quartz-crystal wafer W110, lid wafer W120, and base wafer W130 are bonded together. For bonding, the frame portion 112 of the quartz-crystal wafer W110, the bonding surface 121 of the lid wafer W120, and the bonding surface 132 of the base wafer W130 are aligned with each other along a Y'-axis. These surfaces are bonded together using the sealing material 140 (see FIG. 2) to form a three-wafer sandwich.

In step S105, the three-wafer sandwich is divided into individual devices by cutting along the scribe lines 170 indicated in FIGS. 5, 8, and 9. Thus, as shown in FIG. 1, multiple individual quartz-crystal devices 100 are produced.

Width of the Through-Slot

Regarding the rate at which quartz-crystal material can be etched, etching along the Z-axis, which is a crystallographic axis of the quartz crystal, is fastest, while etching along the X-axis is slowest. Consequently, AT-cut quartz-crystal material etches in an anisotropic manner. As indicated in the regions 171a and 171b (each encircled by a respective dotted line in FIG. 6), the quartz-crystal wafer W110 etches to form a slope relative to the principal surface of the quartz-crystal wafer W110.

FIG. 10A shows the etching rate of the through-slot 113 of the quartz-crystal wafer W110. Specifically, FIG. 10A depicts a situation before commencing formation of the through-slot 113 in FIG. 7D, and indicates the respective positions at which the first and second through-slots 113a, 113b are formed. The dotted lines in FIG. 10A denote etching profiles of the through-slot 113 at respective times after commencing etching. In the slot 113a, the +Z'-edge extending in the −Y'-axis direction is denoted A1, the +Z'-edge extending in the +Y'-axis direction is denoted B1, the −Z'-edge extending in the −Y'-axis direction is denoted C1, and the −Z'-edge extending in the +Y'-axis direction is denoted D1. In the slot 113b, the +Z'-edge extending in the −Y'-axis direction is denoted A2, the +Z'-edge extending in the +Y'-axis direction is denoted B2, the −Z'-edge extending in the −Y'-axis direction is denoted C2, and the −Z'-edge extending in the +Y'-axis direction is denoted D2.

The rate of etching of the quartz-crystal wafer W110 during the formation of the through-slot 113 is shown in FIG. 10A, in which the line C1-D1 of the first through-slot 113a and the line A2-B2 of the second through-slot 113b have the fastest etching rates. The etching rate of the line A1-B1 of the through-slot 113a is lower, while the etching rate of the line C2-D2 of the through-slot 113b is lowest. These differences in etching rate may reflect differences in circulation of the etching solution. For example, the etching solution tends to circulate better over planar surfaces, such as C1 and A2, than over surfaces having steps, such as B1 and D2. Also, it appears that the etching solution tends to circulate better over A1 and D2 than over B1 and C2 where the etched surface is below the plane of the metal film 180. Such differences in the etching rate creates convexities and concavities on the edge surfaces 118a of the first and second through-slots 113a and 113b of the vibrating portion 111, and on the edge surface 118b of the frame portion 112 after formation of the through-slot 113.

FIG. 10B is a cross-sectional view through the portion of the quartz-crystal wafer W110 shown in FIG. 10A, but including an enlargement of the through-slot 113. If the through-slot 113 continues to be etched according to the rate profiles shown in FIG. 10A, the convexities and concavities initially formed on the edge surfaces 118a and 118b gradually become planarized. FIG. 10B indicates such a situation in which the edge surface 118a continues etching until it planarizes without any significant concavity or convexity, even though the edge surface 118b continues to have concavities and convexities. Since the frame portion 112 is thicker in the Y'-axis direction than the periphery of the vibrating portion 111, concavities and convexities formed on the edge surface 118b of the frame portion 112 have larger stepwise differences between each convexity or concavity. Therefore, convexities and concavities remain on the edge surface 118b after planarization of the edge surface 118a is complete. This effect, in which the planar edge surface 118a of the vibrating portion 111 is formed by etching progressing in the Z'-axis direction in the through-slot 113 while convexities and concavities remain on the opposing edge surface of the frame portion 112, is observed particularly during formation of the plan profile of the vibrating portion 111 (see steps S208-S210 in FIG. 7) that occurs when forming the steps on the vibrating portion 111 (see steps S203-S207 in FIGS. 6 and 7) and when forming the through-slot 113.

FIG. 10C is table of results obtained during experiments performed to determine whether the through-slot 113 extends completely in the Y'-axis direction if its width in the Z'-axis direction is altered between the first through-slot 113a and the second through-slot 113b. FIG. 10C shows the result of four experiments, denoted Ex1-Ex4, respectively. In each experiment, the width L112 (see FIG. 2B) in the Z'-axis direction, which is a sum of the width of the vibrating portion 111 and the width of the through-slot 113, is 0.9 mm, and the duration of etching is equal in all experiments. Situations in which the through-slots extend completely in the thickness dimension are denoted by "O", while situations in which the through-slot did not extend completely in the thickness dimension are denoted "X".

In Ex1, the Z'-width L113a of the first through-slot 113a and the Z'-width L113b of the second through-slot 113b are each 0.07 mm. Here, the Z'-width L111 (see FIG. 2B) of the vibrating portion 111 is 0.76 mm. In Ex1, neither the first through-slot 113a nor the second through-slot 113b completely extends through (thickness-wise) in the Y'-axis direction.

In Ex2, the Z'-width L113a of the first through-slot 113a and the Z'-width L113b of the second through-slot 113b are each 0.08 mm. Here, the Z'-width L111 of the vibrating portion 111 is 0.74 mm. In Ex2, the first through-slot 113a extends completely through in the Y'-axis direction, but the second through-slot 113b does not.

In Ex3, the Z'-width L113a of the first through-slot 113a and the Z'-width L113b of the second through-slot 113b are each 0.10 mm. Here, the Z'-width L111 of the vibrating portion 111 is 0.70 mm. In this experiment Ex3 both the first through-slot 113a and the second through-slot 113b completely extend through in the Y'-axis direction.

In Ex4, the Z'-width L113a of the first through-slot 113a is 0.08 mm, and the Z'-width L113b of the second through-slot 113b is 0.10 mm. Here, the Z'-width L111 of the vibrating portion 111 is 0.72 mm. In this experiment Ex4 both the first through-slot 113a and the second through-slot 113b completely extend through in the Y'-axis direction.

In an AT-cut vibrating piece, if the width of the first through-slot 113a equals the width of the second through-slot 113b, the widths L113a and L113b are each 0.10 mm or greater, as revealed in Ex3 (FIG. 10C). In a vibrating piece 110 used in the quartz-crystal device 100, the width L113a of the first through-slot is typically greater than the width L113b of the second through-slot 113b. For example, as shown in Ex4 in FIG. 10C, the width L111 of the vibrating portion 111 in the Z'-axis direction can be 0.72 mm, thus being larger by 0.02 mm from what was obtained in Ex3. Thus, in Ex4 (see FIG. 3C), the vibrating portion 111 can be made wider without adversely affecting the number of quartz-crystal vibrating pieces formed on a wafer. To produce stable vibrations, the vibrating portion 111 desirably is wider.

Figure 11A:
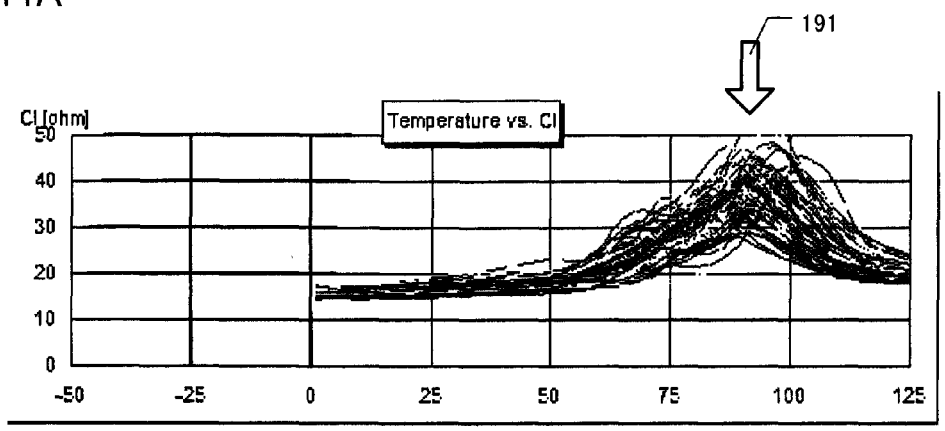

A correlative relationship is found among the Z'-width L111 of the vibrating portion 111, the crystal impedance (CI) value of the device, and temperature of the device. See FIGS. 11A-11C. FIG. 11A shows the relationship between the temperature of the vibrating piece 110 and its CI-value whenever the width L111 of the vibrating portion is L111a. In this graph, the ordinate is CI (ohms) and the abscissa is temperature (° C.). In FIG. 11A, the relationship between temperature and CI was measured on multiple vibrating pieces 110, and each result is indicated by a respective curve. FIG. 11A indicates that, if the width of the width L111 of the vibrating portion is L111a, CI is at a maximum at approximately 90° C. (arrow 191).

Figure 11B:
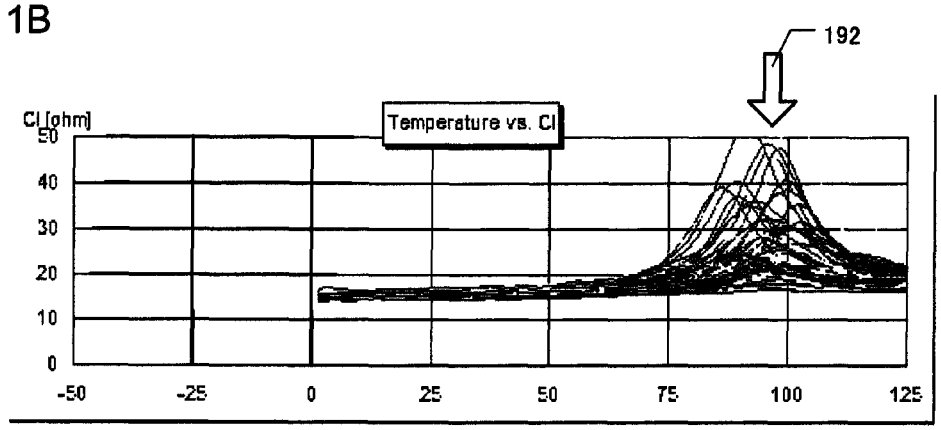
FIG. 11B is a graph showing the relationship between temperature and CI of a quartz-crystal vibrating piece having a vibrating portion of which the width is L111b.

FIG. 11B shows the relationship between the temperature of the vibrating piece 110 and CI whenever the width L111 of the vibrating portion 111 is L111b. The width L111b is 0.05 mm less than L111a. FIG. 11B indicates that, if the width L111 of the vibrating portion 111 is L111b, CI is at a maximum at approximately 95° C. (arrow 192).

Figure 11C:
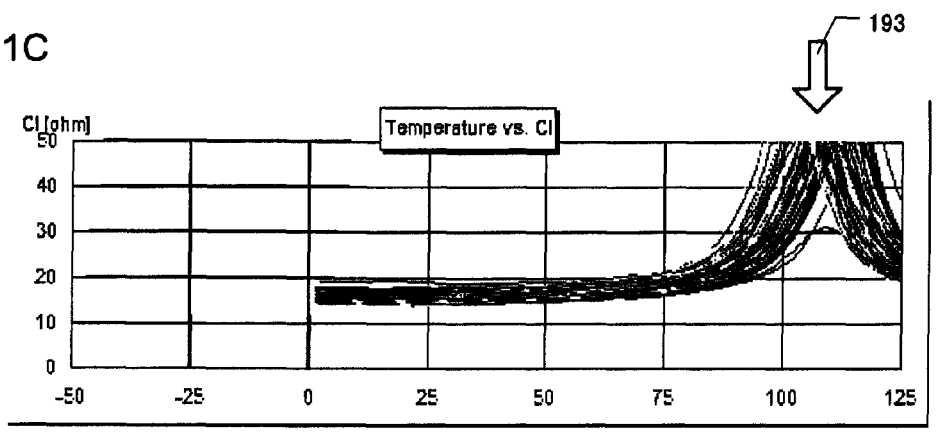
FIG. 11C is a graph showing the relationship between temperature and CI of a quartz-crystal vibrating piece having a vibrating portion of which the width is L111c.

FIG. 11C shows the relationship between the temperature of the vibrating piece 110 and CI whenever the width L111 of the vibrating portion 111 is L111c. The width L111c is 0.01 mm less than L111a. FIG. 11C indicates that, if the width L111 of the vibrating portion 111 is L111c, CI is at a maximum at approximately 110° C. (arrow 193).

According to FIGS. 11A-11C, if the width L111 of the vibrating portion 111 of the vibrating piece 110 changes by 0.010 mm, the temperature at which CI is maximal changes by 20° C. Thus, the width L111 of the vibrating portion 111 is desirably controlled accurately since it has an important effect on the CI of the vibrating piece 110.

As described, convexities and concavities are formed on the Z'-surfaces of the vibrating portion during etching. It difficult to control the dimensions of the convexities and concavities in the Z'-axis direction, which creates inconsistency of the dimensional range of these convexities and concavities in the Z'-axis direction from one product unit to the next. This, in turn, creates inconsistency in the CI value of each vibrating piece in a production batch, as indicated in FIGS. 11A-11C. Also, whenever convexities and concavities are formed on both the +Z'-surface and –Z'-surface of the vibrating portion and these convexities and concavities do not align with each other, the vibration frequency and CI value of the vibrating piece are more likely adversely affected. This is because the Z'-direction width of the vibrating portion 111 changes depending on position in the Y'-axis direction. In the vibrating piece 110, since the first through-slot 113a of the vibrating portion 111 and the edge surface 118a of the second through-slot 113b are formed on respective planar surfaces (lacking any concavity or convexity; see FIG. 10B), the Z'-width of the vibrating portion 111 can be easily controlled. Also, changes in vibration frequency and CI value caused by inconsistent Z'-width of the vibrating portion 111 can be prevented.

Second Embodiment of Quartz-Crystal Device

In the quartz-crystal vibrating piece, the Z'-axis direction can be a long side and the Z-axis direction can be a short side. Hereinbelow, respective quartz-crystal vibrating pieces 210, 310 having long sides in the Z'-axis direction and short sides in the X-axis direction, are described.

Figure 12A:
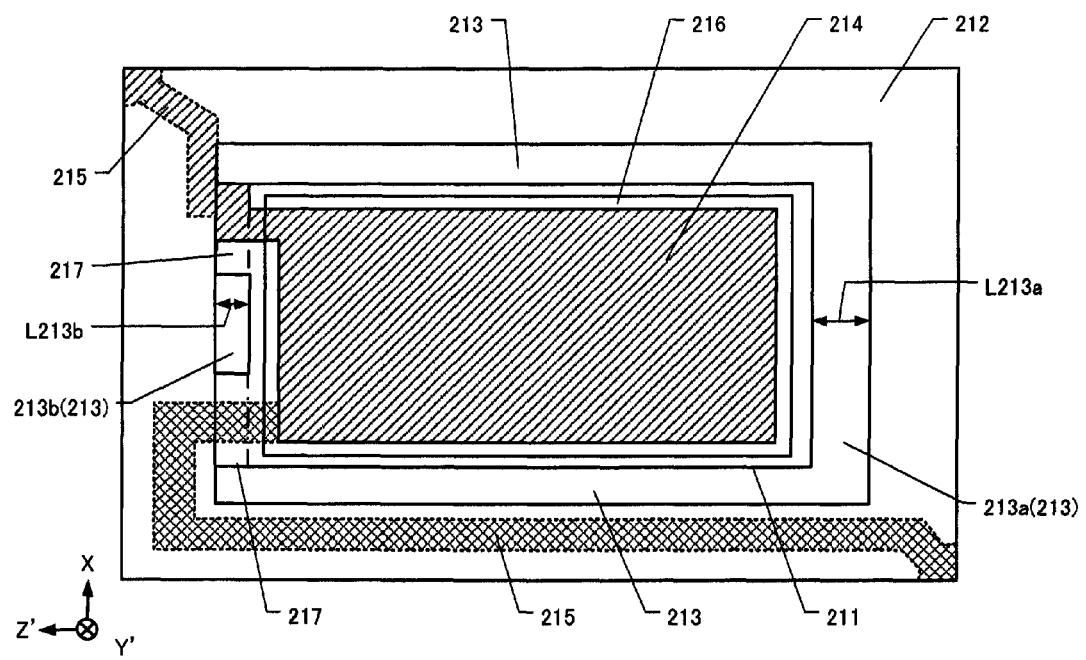
FIG. 12A is a plan view of a second embodiment of a quartz-crystal vibrating piece.

FIG. 12A is a plan view of the quartz-crystal vibrating piece 210, which comprises a quartz-crystal vibrating portion 211, a frame portion 212, a through-slot 213, and joining portions 217. The vibrating portion 211 is mesa-shaped, and a respective excitation electrode 214 is formed on each of the +Y'- and –Y'-surfaces of the mesa portion 216. Each excitation electrode 214 is connected to a respective extraction electrode 215, and the extraction electrodes extend to respective corners of the frame portion 212. The through-slot 213 extends along both the +X-axis and –X-axis sides of the vibrating portion and also along the –Z'-axis side of the vibrating portion 211. The portion of the through-slot 213 situated on the –Z'-side of the vibrating portion 211 and extending parallel to the X-axis is denoted the first through-slot 213a, which has a width L213a. The portion of the through-slot 213 situated on the –Z'-side of the vibrating portion 211 and extending parallel to the X-axis is denoted the second through-slot 213b, which has a width L213b. Note that L213a>L213b.

Third Embodiment of Quartz-Crystal Device

Figure 12B:
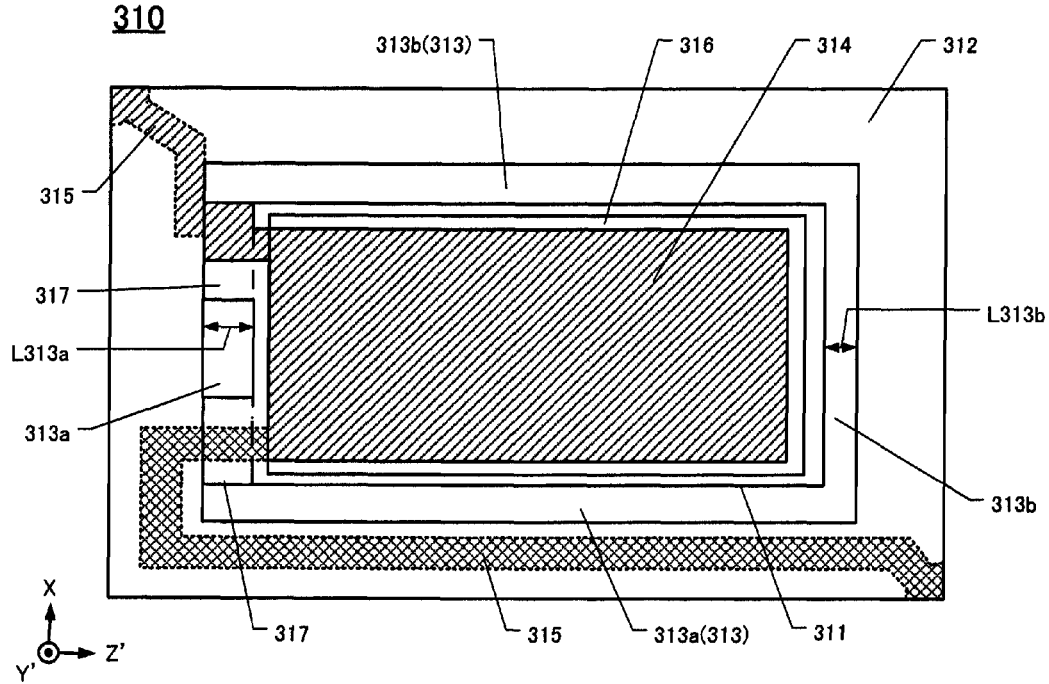
FIG. 12B is a plan view of a third embodiment of a quartz-crystal vibrating piece.

FIG. 12B is a plan view of a quartz-crystal vibrating piece 310 according to this embodiment. The vibrating piece 310 comprises a quartz-crystal vibrating portion 311, a frame portion 312, a through-slot 313, and joining portions 317. The vibrating portion 311 is mesa-shaped, and a respective excitation electrode 314 is formed on each of the +Y'- and –Y'-surfaces of the mesa portion 316. Each excitation electrode is connected to a respective extraction electrode 315, and the extraction electrodes extend to respective corners of the frame portion 312. The through-slot 313 extends along both the +X-axis and –X-axis sides of the vibrating portion and also along the –Z'-axis side of the vibrating portion 311. The portion of the through-slot 313 situated on the +Z'-side of the vibrating portion 311 and extending parallel to the X-axis is denoted the first through-slot 313a, which has a width L313a. The portion of the through-slot 213 situated on the –Z'-side of the vibrating portion 311 and extending parallel to the X-axis is denoted the second through-slot 313b, which has a width L313b. Note that L313a>L313b.

Exemplary Method for Manufacturing Quartz-crystal Vibrating Pieces

The quartz-crystal vibrating pieces 210, 310 are each manufactured by fabricating respective quartz-crystal wafers that produce multiple quartz-crystal vibrating pieces 210, 310. The quartz-crystal wafers are manufactured according to the method for manufacturing a quartz-crystal wafer W110 shown in FIGS. 6 and 7. However, when applying a second mask in step S206 and a third mask in step S209, the Z'-axis direction in the first etching region (including the first through-slot 213a, 313a, respectively) is formed wider than the second etching region (including the second through-slot 213b, 313b, respectively).

In the quartz-crystal vibrating pieces 210 and 310, the quartz-crystal device is formed by bonding together the first plate and the second plate having long side in the X-axis direction and short side in the Z'-axis direction. This method for manufacturing the quartz-crystal device includes the same steps as the manufacturing method of the quartz-crystal device 100 shown in FIG. 4.

INDUSTRIAL APPLICABILITY

Representative embodiments are described in detail above. As will be evident to those skilled in the relevant art, the present invention may be changed or modified in various ways within the technical scope thereof. For example, in the description of the method for manufacturing the vibrating portion, although the vibrating portion and through-slot are formed using a positive photoresist, a negative photoresist alternatively can be used. Since unexposed negative photoresist is soluble in developer and loses its solubility when exposed, the region destined to be etched should be covered with the mask during exposure. Also, although various embodiments were described as having mesa-shaped vibrating pieces in which central regions are thicker in the Y'-axis direction peripheral regions, the mesa-shaped vibrating piece can be replaced with a vibrating piece having a completely planar surface.

What is claimed is:

1. An AT-cut quartz-crystal vibrating piece, having a longitudinal-axis direction denoted as an X-axis direction, a thickness direction denoted as a Y'-axis direction, and a short axis direction denoted as a Z'-axis direction, the vibrating piece comprising:
    a quartz-crystal vibrating portion that vibrates when electrically energized, the vibrating portion having an X-axis dimension and a Z'-axis dimension;
    a frame portion surrounding the vibrating portion; and
    a through-slot defined between the vibrating portion and the frame portion, the through-slot extending thickness-wise through the vibrating piece in the Y'-axis direction, wherein
    the through-slot includes a first through-slot extending in the X-axis direction along a +Z-edge of the vibrating portion and a second through-slot extending in the X-axis direction along a –Z'-edge of the vibrating portion;
    the first and second through-holes have respective minimum widths in the Z'-axis direction; and
    the minimum width of the first through-slot is different from the minimum width of the second through-slot.

2. The AT-cut quartz-crystal vibrating piece of claim 1, wherein the Z'-direction width of the first through-slot is less than the Z'-direction width of the second through-slot.

3. The AT-cut quartz-crystal vibrating piece of claim 1, wherein the frame portion has greater Y'-axis thickness than the vibrating portion.

4. A quartz-crystal device, comprising:
the AT-cut quartz-crystal vibrating piece of claim 1, the AT-cut quartz-crystal vibrating piece comprising a +Y'-surface and a −Y'-surface;
a first plate bonded to the +Y'-surface; and
a second plate bonded to the −Y'-surface.

5. The AT-cut quartz-crystal vibrating piece of claim 1, wherein the vibrating portion is mesa-shaped, having a Y'-direction thickness in a central region thereof that is greater than a Y'-direction thickness in a peripheral region thereof.

6. The AT-cut quartz-crystal vibrating piece of claim 1, wherein:
the vibrating portion comprises a −Z'-edge surface and a +Z'-edge surface facing respective first and second through-slots; and
the −Z'-edge surface and +Z'-edge surface are planar surfaces.

7. The AT-cut quartz-crystal vibrating piece of claim 1, wherein the minimum width of the first through-slot is greater than the minimum width of the second through-slot.

8. An AT-cut quartz-crystal vibrating piece, having a longitudinal-axis direction denoted as a Z'-axis direction, a thickness direction denoted as a Y'-axis direction, and a short-axis direction denoted as an X-axis direction, the vibrating piece comprising:
a quartz-crystal vibrating portion that vibrates when electrically energized, the vibrating portion having an X-axis dimension and a Z'-axis dimension;
a frame portion surrounding the vibrating portion; and
a through-slot defined between the vibrating portion and the frame portion, the through-slot extending thickness-wise through the vibrating piece in Y'-axis direction, wherein
the through-slot includes a first through-slot extending in the X-axis direction along a +Z'-edge of the vibrating portion and a second through-slot extending in the X-axis direction along a −Z'-edge of the vibrating portion;
the first and second through-slots have respective minimum widths in the Z'-axis direction; and
the minimum width of the first through-slot is different from the minimum width of the second through-slot.

9. The AT-cut quartz-crystal vibrating piece of claim 8, wherein the Z'-direction width of the first through-slot is less than the Z'-direction width of the second through-slot.

10. The AT-cut quartz-crystal vibrating piece of claim 8, wherein the minimum width of the first through-slot is greater than the minimum width of the second through-slot.

* * * * *

UNITED STATES PATENT AND TRADEMARK OFFICE
CERTIFICATE OF CORRECTION

PATENT NO. : 8,779,652 B2  Page 1 of 1
APPLICATION NO. : 13/334640
DATED : October 13, 2015
INVENTOR(S) : Mizusawa et al.

It is certified that error appears in the above-identified patent and that said Letters Patent is hereby corrected as shown below:

In the Specification:

Column 10, line 11, "lines 170 In" should read --lines 170 in--.

Column 11, line 47, "is table" should read --is a table--.

Column 12, lines 65-66, "It difficult" should read --It is difficult--.

Signed and Sealed this
Eighth Day of March, 2016

Michelle K. Lee
*Director of the United States Patent and Trademark Office*